United States Patent
Tallman et al.

(10) Patent No.: US 6,785,104 B2
(45) Date of Patent: Aug. 31, 2004

(54) LOW ENERGY PULSING DEVICE AND METHOD FOR ELECTRICAL SYSTEM ARC DETECTION

(75) Inventors: David M. Tallman, Marshall Township, PA (US); Robert T. Elms, Monroeville, PA (US)

(73) Assignee: Eaton Corporation, Cleveland, OH (US)

( * ) Notice: Subject to any disclaimer, the term of this patent is extended or adjusted under 35 U.S.C. 154(b) by 233 days.

(21) Appl. No.: 10/091,074

(22) Filed: Mar. 5, 2002

(65) Prior Publication Data

US 2003/0169545 A1 Sep. 11, 2003

(51) Int. Cl.⁷ ............................................... H02H 3/00
(52) U.S. Cl. ........................................ 361/42; 324/520
(58) Field of Search ...................... 361/42–50; 324/520, 324/527, 528, 529, 531, 534, 536, 538, 541, 551

(56) References Cited

U.S. PATENT DOCUMENTS

| | | | |
|---|---|---|---|
| 4,081,852 A | 3/1978 | Coley et al. | 361/45 |
| 4,144,487 A | 3/1979 | Pharney | 324/52 |
| 4,291,204 A | * 9/1981 | Crick | 324/456 |
| 5,224,006 A | 6/1993 | MacKenzie et al. | 361/45 |
| 5,459,630 A | 10/1995 | MacKenzie et al. | 361/45 |
| 5,691,869 A | 11/1997 | Engel et al. | 361/42 |
| 5,982,593 A | 11/1999 | Kimblin et al. | 361/42 |
| 6,072,317 A | 6/2000 | Mackenzie | 324/536 |
| 6,084,756 A | 7/2000 | Doring et al. | 361/45 |

OTHER PUBLICATIONS www.munroelectric.com/catalog/greenlee/circuit.html; "Circuit Tracer Application Guide", pp. 2–4, Feb. 15, 2002.
Greenlee, "Circuit Testers, Locators and Tracers", pp. 40–45, 2002.

* cited by examiner

*Primary Examiner*—Ronald Leja
(74) *Attorney, Agent, or Firm*—Martin J. Moran

(57) ABSTRACT

A pulsing apparatus for an electrical system includes line and neutral terminals structured to input a nominal alternating current line voltage, a timing mechanism or circuit for generating a timing signal having a duty cycle from the line voltage; a transformer for transforming the line voltage to a stepped up voltage having the duty cycle; load and load neutral terminals; and an output circuit for outputting a current at about the stepped up voltage to the load and load neutral terminals. The stepped up voltage is greater than the line voltage and less than a rated voltage of the electrical system. The stepped up voltage is adapted to identify an arcing fault in the electrical system. The duty cycle limits an average value of the current to less than about 4 mA to about 6 mA.

10 Claims, 2 Drawing Sheets

LOW ENERGY PULSING DEVICE AND METHOD FOR ELECTRICAL SYSTEM ARC DETECTION

CROSS-REFERENCE TO RELATED APPLICATION

This application is related to commonly assigned, concurrently filed U.S. patent application Ser. No. 10/090,991, filed Mar. 5, 2002, entitled "Testing Device For Detecting And Locating Arc Faults In An Electrical System".

BACKGROUND OF THE INVENTION

1. Field of the Invention

This invention relates to testing of electrical systems and, more particularly, to devices for arc fault testing of electrical distribution circuits. The invention also relates to a method for arc fault testing of electrical distribution circuits.

2. Background Information

The common type of circuit breaker used for residential, commercial, and light industrial applications has an electromechanical thermal-magnetic trip device to provide an instantaneous trip in response to a short circuit and a delayed trip in response to persistent overcurrent conditions. Some of these circuit breakers include ground fault protection, which trips the ground fault circuit interrupter (GFCI) in response to a line-to-ground fault, and in some cases, a neutral-to-ground fault. Ground fault protection is provided by an electronic circuit which is set to trip at about 4 to 6 mA of ground fault current for people protection, and at about 30 mA for equipment protection. It is known to incorporate a test circuit in the circuit breaker, which tests at least portions of the electronic ground fault trip circuit. It is also known to test for proper wiring connections. Test circuits for this purpose are commercially available.

Recently, there has been rising interest in also protecting such power distribution circuits, and particularly the branch circuits for homes, commercial and light industrial applications, from arcing faults. Arcing faults are intermittent, high impedance faults, which can be caused for instance by worn or damaged insulation, loose connections, broken conductors and the like. Arcing faults can occur in the permanent wiring, at receptacles, or more likely, in the wiring of loads or extension cords plugged into a receptacle. Because of the intermittent and high impedance nature of arcing faults, they do not generate currents of sufficient instantaneous magnitude or sufficient average current to trigger the thermal-magnetic trip device which provides the short circuit and overcurrent protection.

Various types of arc fault detectors have been developed and/or proposed. Generally, the detectors are of two types. One type responds to the random high frequency noise content of the current waveform generated by an arc. This high frequency noise tends to be attenuated, especially by the presence of filters on some loads, which can be connected to the branch circuit. The other basic type of arc fault detector responds to the step increase in current occurring as the arc is repetitively and randomly struck. Examples of arc fault detectors of the latter type are disclosed in U.S. Pat. Nos. 5,224,006; and 5,691,869.

U.S. Pat. No. 5,459,630 discloses several forms of built-in test circuits for arc fault detectors. In one embodiment, in which the arc fault detector utilizes a coil to sense current, the test circuit adds a capacitor which forms with the impedance of the coil an oscillator generating a waveform with an amplitude which simulates the rapid rise of a step change in current produced by an arc. In another embodiment, the user must repetitively close a switch, which connects a resistor between the line conductor and neutral, to again generate large amplitude pulses.

While the built-in arc fault and ground fault testers test the response of the electronic circuits to simulated conditions, they do not necessarily indicate whether the device will adequately respond in a real installation. One difficulty is that the circuit breaker containing the detectors is located at a load center together with the circuit breakers for other circuits in the installation. However, the fault condition can occur anywhere downstream and can be further distanced from the circuit breaker and detectors by an extension cord. The wiring, and particularly the extension cord, can insert considerable resistance between the fault and the detector, which attenuates the signal sensed by the detector. When the effects of this resistance are combined with the low amplitude of the currents generated by these faults, the detectors may not have sufficient sensitivity to detect remote faults. Another problem can arise when a receptacle is not connected as intended.

Detection of an arcing fault is complicated by the fact that some normal loads can produce waveforms similar to arcing faults. Arc fault detectors attempt to distinguish over such phenomena to minimize nuisance faults. The task is further complicated by the fact that, as mentioned above, arcing faults tend to be smaller in amplitude than dead faults. Furthermore, arcing faults tend to be relatively intermittent.

With the introduction of arc fault circuit interrupter (AFCI) devices, such as arc fault circuit breakers, there exists the need for a method and apparatus for determining the location of problems within electrical wiring.

There is also a need for such an apparatus, which is flexible, simple, safe, and economical.

SUMMARY OF THE INVENTION

These needs and others are met by the present invention, which enables suitable voltage and current levels to be safely applied to an electrical system having an arcing fault condition without creating a hazardous or unsafe condition.

As one aspect of the invention, a pulsing apparatus for an electrical system comprises: first terminals structured to input a first voltage being about a nominal voltage of the electrical system; means for generating a signal from the first voltage, the signal having a duty cycle; means for transforming the first voltage to a second voltage having the duty cycle; second terminals; and means for outputting a current at about the second voltage to the second terminals, wherein the second voltage is greater than the first voltage and less than a rated voltage of the electrical system, the second voltage being adapted to identify an arcing fault in the electrical system, and wherein the duty cycle limits an average value of the current to less than about 6 mA.

As another aspect of the invention, a method for identifying an arcing fault in an electrical system comprises the steps of: inputting a first voltage, the first voltage being about a nominal voltage of the electrical system; generating a signal from the first voltage, the signal having a duty cycle; transforming the first voltage to a second voltage having the duty cycle, the second voltage being greater than the first voltage and less than a rated voltage of the electrical system, the second voltage being adapted to identify an arcing fault in the electrical system; outputting a current at about the second voltage to the electrical system; and employing the duty cycle to limit an average value of the current to less than about 6 mA.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The present invention applies a limited current (e.g., less than about 4 to about 6 mA), suitably low duty cycle (e.g., about 1%), limited energy test voltage to an electrical system, such as fixed electrical wiring. This permits the determination of one or more arcing fault locations when an AFCI device, such as a circuit breaker, has tripped due to an arcing fault in the fixed electrical wiring.

As employed herein, the term "terminal" shall expressly include, but not be limited to, any suitable device attached to the end of a wire, a cable, a conductor or an electrical apparatus for making an electrical connection (e.g., a compression terminal, a stab, a wire pigtail).

The invention is preferably used in combination with a suitable arc fault detection system such as disclosed in commonly assigned, concurrently filed application Ser. No. 10/090,991, filed Mar. 5, 2002, entitled "Testing Device For Detecting And Locating Arc Faults In An Electrical System".

Figure 1:
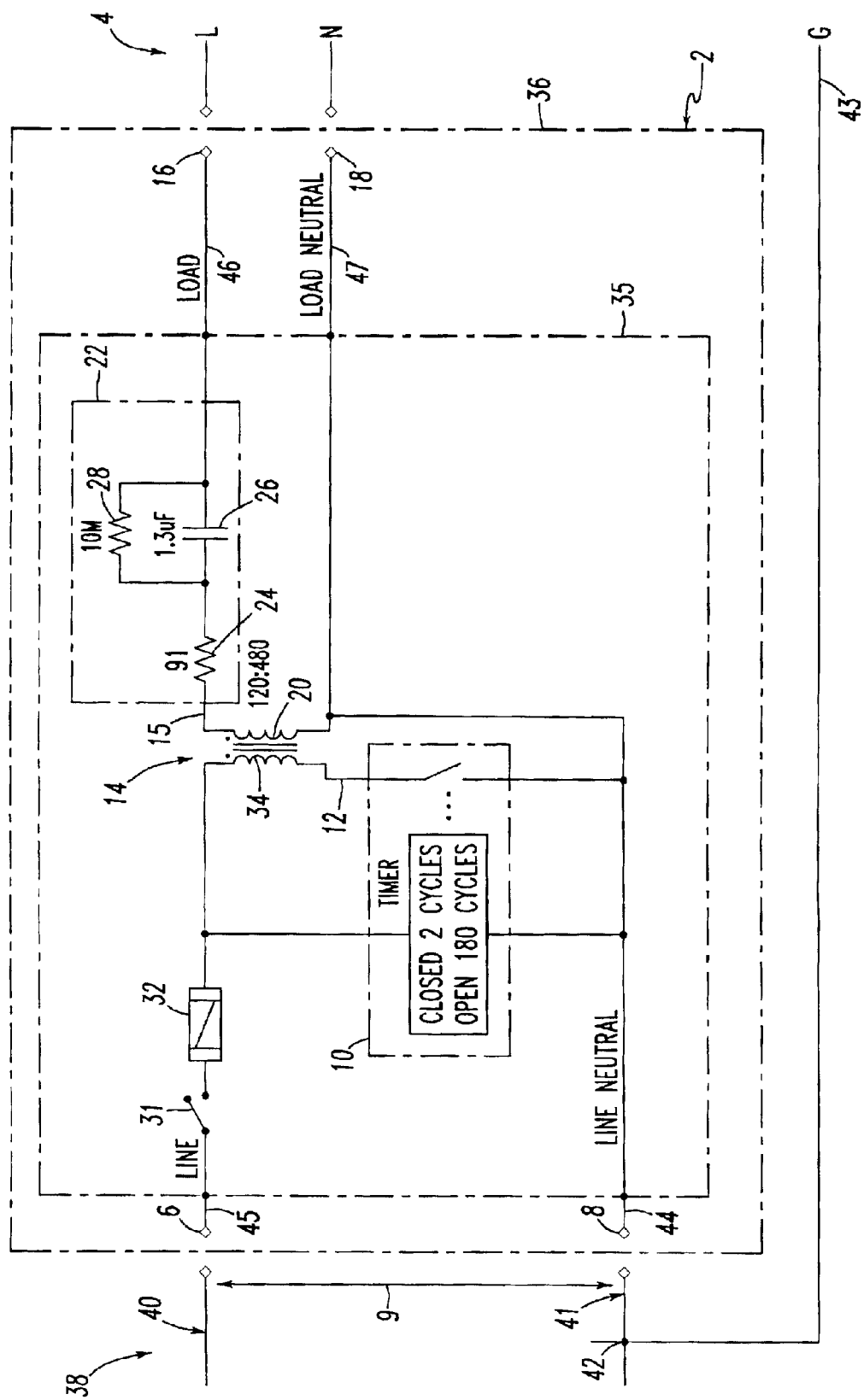
FIG. 1 is a block diagram in schematic form of a pulsing device which generates relatively low energy, low duty cycle pulses for arc fault testing in accordance with the present invention.

FIG. 1 shows a pulsing device 2 which generates relatively low energy, low duty cycle pulses for arc fault testing of a downstream electrical system, such as power circuit 4. The pulsing device 2 includes a line terminal 6 and a line neutral terminal 8 structured to input a line voltage 9 (e.g., a nominal 120 $VAC_{RMS}$ line voltage). A suitable timing mechanism or circuit 10 generates a signal 12 having a duty cycle from the line voltage 9. A step up transformer 14 transforms the line voltage 9 to a relatively higher voltage 15 (e.g., a nominal 480 $VAC_{RMS}$ line voltage) having the duty cycle. The pulsing device 2 also includes a load terminal 16 and a load neutral terminal 18, which is electrically connected to one side of the secondary winding 20 of the transformer 14. A circuit 22 is electrically connected between the other side of the transformer secondary winding 20 and the load terminal 16 for outputting a current at about the relatively higher voltage 15. The circuit 22 includes a first resistor 24 electrically connected in series with a capacitor 26. The series combination of the first resistor 24 and the capacitor 26 are electrically connected between the transformer secondary winding 20 and the load terminal 16. A second resistor 28 is electrically connected in parallel with the capacitor 26.

In the exemplary embodiment, there is a nominal 120 $VAC_{RMS}$ line voltage 9, the transformer 14 is a 1:4 step up transformer, and the relatively higher voltage 15 is a line voltage of about 480 $VAC_{RMS}$, which is less than the rated voltage (e.g., 600 $VAC_{RMS}$) of the fixed branch electrical circuit wiring of the electrical system 4, in order to advantageously identify one or more arcing faults therein.

The exemplary pulsing device 2 employs the transformer 14 to step up the 120 $VAC_{RMS}$ line voltage 9 from the line terminal 6 and to periodically (e.g., about every 3 s) apply 480 VACRms to the load terminal 16 for about two cycles. If the insulation of the fixed branch electrical circuit wiring is not faulty, then no arcing breakdown occurs. On the other hand, if the insulation has failed or is sufficiently degraded, then current limited (e.g., less than about 0.25 $AAC_{RMS}$ under high line conditions) arcing occurs. In turn, a suitable testing device (not shown), detects that arcing.

The timing mechanism or circuit 10 of the pulsing device 2 pulses the 480 VACRms load terminal 16 "ON" for about two cycles and "OFF" for about 178 cycles out of about every three seconds (i.e., two cycles out of about every 180 cycles). Hence, during an arcing fault, the average value of the current, as advantageously limited by the duty cycle, is less than about 4 mA to about 6 mA, which is a safe value of average current (e.g., less than about the 4 mA to about 6 mA ground fault trip threshold for people protection) as permitted by UL 943 (Ground-Fault Circuit-Interrupters) intended for use in alternating current circuits, such as 120 $VAC_{RMS}$ or 120/240 $VAC_{RMS}$, 50 or 60 Hz circuits). For the exemplary duty cycle, the average value of the current is about 2.8 mA (i.e., 0.25 $AAC_{RMS} \times (2/180)$).

As shown in FIG. 1, the pulsing device 2 preferably includes an on/off switch 31 electrically connected between line terminal 6 and a circuit interrupting device, such as the exemplary slow blow fuse (e.g., 0.5 A) 32, which is electrically connected between switch 31 and the primary winding 34 of the transformer 14. A ratio of the count of the turns of the transformer secondary winding 20 to the count of the turns of the primary winding 34 is about four, in order to step up the exemplary 120 $VAC_{RMS}$ line voltage 9 to the 480 $VAC_{RMS}$ voltage 15.

Figure 2:
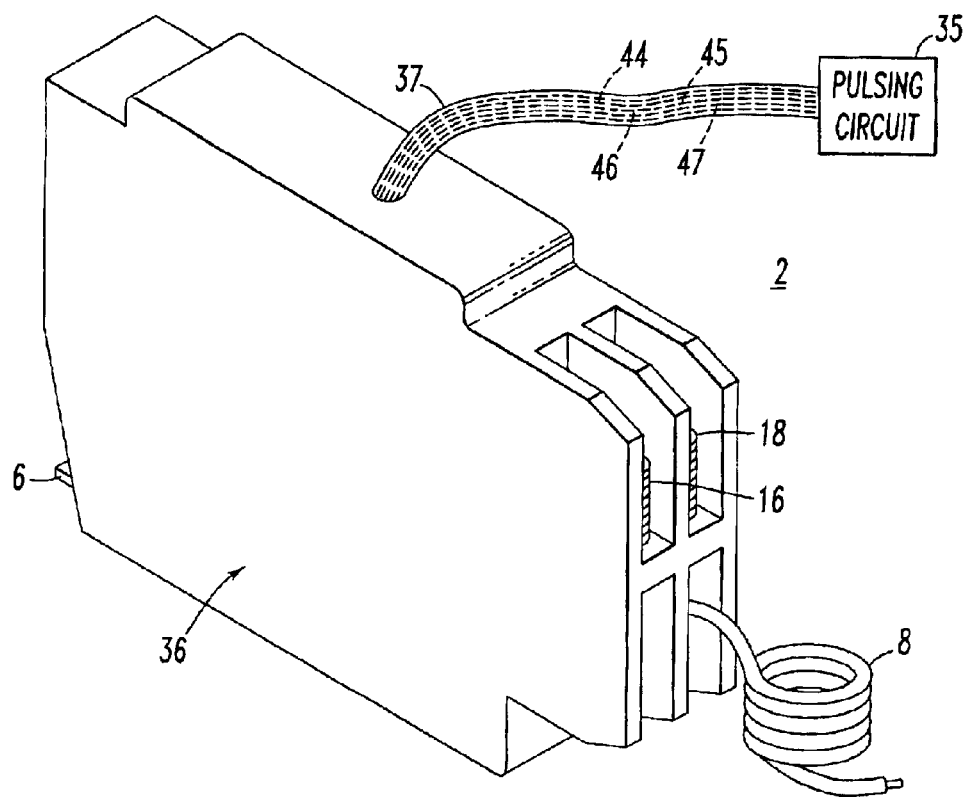
FIG. 2 is an isometric view of the pulsing device of FIG. 1 including a circuit breaker housing.

Referring to FIG. 2, the pulsing device 2 of FIG. 1 preferably includes a pulsing circuit 35, an interface housing 36 having a conventional circuit breaker form factor, and an interface cable 37 therebetween. Alternatively, the pulsing circuit 35 may be included in the housing 36 (not shown). Examples of such form factors are disclosed in U.S. Pat. Nos. 4,081,852; and 5,982,593, which are incorporated by reference herein. The interface housing 36 is assembled from a number of molded sections composed of an electrically insulating material, as is well known. The load side terminals 16 (load) and 18 (load neutral) are provided at one end of the housing 36 for connecting the pulsing device 2 to the electrical system 4 of FIG. 1. In this example, the electrical system 4 is a three-wire (e.g., line (L), neutral (N) and ground (G)) system, although the invention is applicable to four-wire (e.g., two lines, neutral and ground) and three-phase systems.

Referring to FIGS. 1 and 2, the line side terminals, such as the stab 6 (line) and the pigtail 8 (line neutral), at the opposite end of the housing 36 connect the pulsing device 2 to a commercial, industrial or residential power distribution system (e.g., through a load center or panel board 38 of FIG. 1) having a line conductor 40 and a neutral conductor 41. As is conventional, the neutral conductor 41 is electrically connected at a common node 42. Similarly, the ground conductor 43 of the electrical system 4 is also electrically connected to the common node 42. The interface cable 37 of FIG. 2 includes four conductors 44,45,46,47. Conductors 44 and 47 are the neutral conductors and electrically connect pigtail 8 to load neutral terminal 18. Conductor 45 electrically connects terminal 6 to on/off switch 31. Conductor 46 electrically connects terminal 16 to circuit 22.

The exemplary pulsing device 2 may advantageously be installed, for example, in place of an AFCI or AFCI/GFCI circuit interrupter or circuit breaker, although the invention is applicable to pulsing devices having different housings, which interface electrical systems in the same or different manners. Preferably, all downstream loads in the electrical system 4 are removed before testing the fixed electrical wiring (e.g., without limitation, conventional three-wire (e.g., line, neutral and ground for 120 $VAC_{RMS}$ as shown in FIG. 1), four-wire (e.g., two lines, neutral and ground for 240 $VAC_{RMS}$) or three-phase electrical conductors, junction boxes, receptacles, light switches, extension cords, and any other electrical and/or mechanical devices between the power source and the load(s)). As shown in FIGS. 1 and 2, the pulsing device 2 receives the line voltage 9 at the line stab 6 of the housing 36 and outputs the low duty cycle, low energy 480 $VAC_{RMS}$ voltage 15 from the terminal 16 of that housing.

Figure 3:
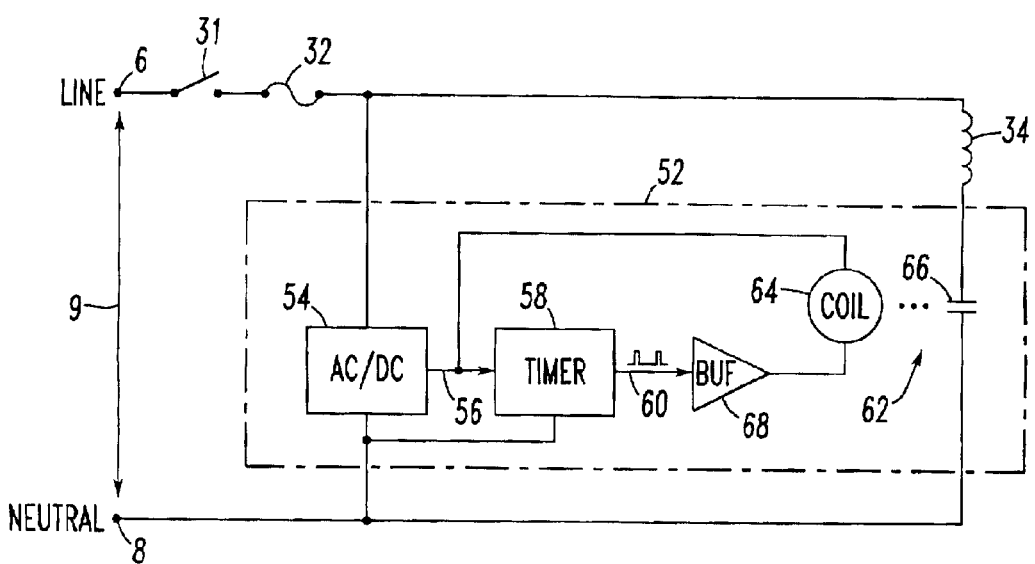
FIG. 3 is a block diagram of the timer circuit of FIG. 1.

FIG. 3 shows a timer circuit 52, which is suitable for use as the timing mechanism or circuit 10 of FIG. 1. The timer circuit 52 includes an AC/DC power supply 54 structured to provide a suitable direct current (DC) voltage 56 from the line voltage 9, a timer, such as a suitable timing signal generator 58, powered from the DC voltage 56 and structured to provide a control signal 60 having a suitable duty cycle (e.g., without limitation, 1%, two of 180 cycles), and a relay 62 including a coil 64 and a contact 66. The coil 64 is powered from the DC voltage 56 and is controlled by the control signal 60. The contact 66 is controlled by the coil 64, in order to energize the transformer primary winding 34 with the line voltage 9 at the duty cycle. A suitable buffer circuit 68, such as a transistor, drives the coil 64 on and off based upon the timing signal 60. Although the coil 64 is energized from the DC voltage 56, a suitable AC coil and buffer (not shown) may be employed. Although an electromechanical timer circuit 52 is shown, the invention is applicable to any suitable timing mechanism or circuit (e.g., a mechanical timer, an electronic timer with a relay contact output, an electronic timer with a solid state output).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A pulsing apparatus for an electrical system having a nominal voltage and a rated voltage, said pulsing apparatus comprising:

first terminals structured to input a first voltage, said first voltage being about said nominal voltage;

means for generating a signal from said first voltage, said signal having a duty cycle;

means for transforming said first voltage to a second voltage having said duty cycle;

second terminals;

means for outputting a current at about said second voltage to said second terminals, wherein said second voltage is greater than said first voltage and less than said rated voltage, said second voltage being adapted to identify an arcing fault in said electrical system;

wherein said duty cycle limits an average value of said current to less than about 6 mA; and wherein said first terminals are structured to input an alternating current voltage as said first voltage.

2. The pulsing apparatus as recited in claim 1 wherein said alternating current voltage is about 120 $VAC_{RMS}$.

3. A pulsing apparatus for an electrical system having a nominal voltage and a rated voltage, said pulsing apparatus comprising:

first terminals structured to input a first voltage, said first voltage being about said nominal voltage;

means for generating a signal from said first voltage, said signal having a duty cycle;

means for transforming said first voltage to a second voltage having said duty cycle;

second terminals;

means for outputting a current at about said second voltage to said second terminals, wherein said second voltage is greater than said first voltage and less than said rated voltage, said second voltage being adapted to identify an arcing fault in said electrical system;

wherein said duty cycle limits an average value of said current to less than about 6 mA; and wherein said first voltage is an alternating current voltage having a plurality of cycles; and wherein said duty cycle includes an on period and an off period.

4. The pulsing apparatus as recited in claim 3 wherein said on period includes about one percent of said cycles.

5. The pulsing apparatus as recited in claim 3 wherein said on period includes about two of said cycles and said off period includes about 178 of said cycles.

6. A pulsing apparatus for an electrical system having a nominal voltage and a rated voltage, said pulsing apparatus comprising:

first terminals structured to input a first voltage, said first voltage being about said nominal voltage;

means for generating a signal from said first voltage, said signal having a duty cycle;

means for transforming said first voltage to a second voltage having said duty cycle;

second terminals;

means for outputting a current at about said second voltage to said second terminals, wherein said second voltage is greater than said first voltage and less than said rated voltage, said second voltage being adapted to identify an arcing fault in said electrical system;

wherein said duty cycle limits an average value of said current to less than about 6 mA; and wherein said first voltage is about 120 $VAC_{RMS}$ and wherein said second voltage is about 480 $VAC_{RMS}$.

7. A pulsing apparatus for an electrical system having a nominal voltage and a rated voltage, said pulsing apparatus comprising:

first terminals structured to input a first voltage, said first voltage being about said nominal voltage;

means for generating a signal from said first voltage, said signal having a duty cycle;

means for transforming said first voltage to a second voltage having said duty cycle;

second terminals; means for outputting a current at about said second voltage to said second terminals, wherein said second voltage is greater than said first voltage and less than said rated voltage, said second voltage being adapted to identify an arcing fault in said electrical system;

wherein said duty cycle limits an average value of said current to less than about 6 mA;

wherein said means for outputting comprises a resistor electrically connected in series with a capacitor, with the senses combination of said resistor and said capacitor being electrically connected between said means for transforming and one of said second terminals; and wherein said means for outputting further comprises a second resistor electrically connected in parallel with said capacitor.

8. A method for identifying an arcing fault in an electrical system having a nominal voltage and a rated voltage, said method comprising the steps of:

inputting a first voltage, said first voltage being about said nominal voltage;

generating a signal from said first voltage, said signal having a duty cycle;

transforming said first voltage to a second voltage having said duty cycle, said second voltage being greater than said first voltage and less than said rated voltage, said second voltage being adapted to identify an arcing fault in said electrical system;

outputting a current at about said second voltage to said electrical system;

employing said duty cycle to limit an average value of said current to less than about 6 mA; and further comprising inputting as said first voltage an alternating current voltage.

9. A method for identifying an arcing fault in an electrical system having a nominal voltage and a rated voltage, said method comprising the steps of:

inputting a first voltage, said first voltage being about said nominal voltage;

generating a signal from said first voltage, said signal having a duty cycle;

transforming said first voltage to a second voltage having said duty cycle, said second voltage being greater than said first voltage and less than said rated voltage, said second voltage being adapted to identify an arcing fault in said electrical system;

outputting a current at about said second voltage to said electrical system;

employing said duty cycle to limit an average value of said current to less than about 6 mA;

further comprising inputting as said first voltage about 120 $VAC_{RMS}$; and outputting as said second voltage about 480 $VAC_{RMS}$.

10. A method for identifying an arcing fault in an electrical system having a nominal voltage and a rated voltage, said method comprising the steps of:

inputting a first voltage, said first voltage being about said nominal voltage;

generating a signal from said first voltage, said signal having a duty cycle;

transforming said first voltage to a second voltage having said duty cycle, said second voltage being greater than said first voltage and less than said rated voltage, said second voltage being adapted to identity an arcing fault in said electrical system;

outputting a current at about said second voltage to said electrical system;

employing said duty cycle to limit an average value of said current to less than about 8 mA;

further comprising transforming said first voltage to about 480 $VAC_{RMS}$; and limiting said average value of said current to about 2.8 mA.

* * * * *